US012424724B2

(12) United States Patent
Staudinger et al.

(10) Patent No.: US 12,424,724 B2
(45) Date of Patent: Sep. 23, 2025

(54) QUADRATURE COUPLERS AND METHODS OF OPERATION

(71) Applicant: NXP USA, Inc., Austin, TX (US)

(72) Inventors: Joseph Staudinger, Gilbert, AZ (US); Michael Lee Fraser, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 199 days.

(21) Appl. No.: 18/366,965

(22) Filed: Aug. 8, 2023

(65) Prior Publication Data
US 2025/0055171 A1  Feb. 13, 2025

(51) Int. Cl.
*H01P 5/16* (2006.01)
*H03F 3/20* (2006.01)

(52) U.S. Cl.
CPC *H01P 5/16* (2013.01); *H03F 3/20* (2013.01)

(58) Field of Classification Search
CPC .. H03F 2200/451; H03F 1/0288; H03F 3/602; H03F 1/56; H03F 2200/387; H03F 2200/192; H03F 2200/204; H03F 1/565; H03F 3/19; H03F 2200/198; H03F 2203/21139; H03F 3/193; H03F 3/211; H01P 5/16; H01P 5/227; H01P 5/186; H01P 5/187; H03H 7/48; H03H 7/0115
See application file for complete search history.

(56) References Cited

U.S. PATENT DOCUMENTS

| 8,704,575 | B2 | 4/2014 | Hur et al. |
| 11,757,422 | B2 * | 9/2023 | Malladi ............ H03H 7/48 |
| | | | 333/112 |

| 2016/0099820 | A1 | 4/2016 | Chakrabarti et al. |
| 2016/0379744 | A1 | 12/2016 | Vaesen |
| 2017/0163235 | A1 | 6/2017 | Zhou et al. |
| 2018/0006352 | A1 * | 1/2018 | Issakov ............ G01R 33/365 |
| 2018/0358676 | A1 | 12/2018 | Laighton et al. |

(Continued)

OTHER PUBLICATIONS

Yi Xiang et al.: "A 3.4-4.6GHz In-Band Full-Duplex Front-End in CMOS Using a Bi-Directional Frequency Converter", 2020 IEEE Radio Frequency Integrated Circuits Symposium (RFIC), IEEE, Aug. 4, 2020, pp. 47-50.

(Continued)

*Primary Examiner* — Lincoln D Donovan
*Assistant Examiner* — Tyler J Pereny
(74) *Attorney, Agent, or Firm* — Sherry W. Gourlay

(57) ABSTRACT

A quadrature coupler includes four ports, four inductors, and six capacitors. The first through third capacitors are coupled in series between the first and fourth ports. A first intermediate node is between the first and second capacitors. A second intermediate node is between the second and third capacitors. The fourth through sixth capacitors are coupled in series between the second and third ports. A third intermediate node is between the fourth and fifth capacitors, and a fourth intermediate node is between the fifth and sixth capacitors. The first inductor is coupled between the first and second ports. The second inductor is coupled between the first and third intermediate nodes. The third inductor is coupled between the second and fourth intermediate nodes. The fourth inductor is coupled between the fourth and third ports. Variable tuning networks may be coupled between the first and fourth ports and the second and third ports.

22 Claims, 7 Drawing Sheets

(56) References Cited

U.S. PATENT DOCUMENTS

2020/0014338 A1    1/2020  Datta
2023/0115944 A1    4/2023  Malladi et al.

OTHER PUBLICATIONS

Chiang, Yi-Chyun, et al; "Design of a Wide-Band Lumped-Element 3-dB Quadrature Coupler"; IEEE Transactions Onmicrowave Theory and Techniques, vol. 49, No. 3; 4 pages (Mar. 2001).
Hou, Jian-An et al; "A Compact Quadrature Hybrid Based on High-Pass and Low-Pass Lumped Elements", IEEE Microwave and Wireless Components Letters, vol. 17, No. 8, 4 pages (Aug. 2007).
Hsieh, Hsieh-Hung et al. "A Compact Quadrature Hybrid MMIC Using CMOS Active Inductors", IEEE Transactions on Microwave Theory and Techniques, vol. 55, No. 6, Jun. 2007, 8 pgs.
Scheeler, Robert et al. "GaAs MMIC Tunable Directions Coupler", IEEE, (Jun. 2012), 3 pgs.
Tung, Wei-Shin et al. "Design of Microwave Wide-Band Quadrature Hybrid Using Planar Transformer Coupling Method", IEEE Transactions on Microwave Theory and Techniques, vol. 51, No. 7, Jul. 2003, 6 pgs.

\* cited by examiner

QUADRATURE COUPLERS AND METHODS OF OPERATION

BACKGROUND

In wireless communication systems, a power amplifier may include a quadrature coupler to split an input radio frequency (RF) signal into two output RF signals that have 90 degrees of phase difference, or alternatively to phase-align and combine two input RF signals that are received with 90 degrees of phase difference into a single output RF signal. A quadrature coupler typically has four ports (e.g., an input port, a direct port, a coupled port, and an isolated port). An ideal quadrature coupler with a coupling factor (K) equal to 0.5 divides the power of an input RF signal received at the input port into two RF signals at the direct and coupled ports, with each of these two RF signals containing 50 percent of the power of the input RF signal. Ideally, no power is delivered to the isolated port. Further, in an ideal quadrature coupler, the phase difference between the RF signals at the direct and coupled ports is exactly 90 degrees. In other words, at the direct and coupled ports, an ideal quadrature coupler has an amplitude split of exactly 50:50 and a phase difference of exactly 90 degrees.

In a more realistic physical implementation of a conventional quadrature coupler, however, a perfect 50:50 power split and an exact 90 degree phase difference at the direct and coupled ports may be achievable only over a relatively narrow bandwidth. In addition, conventional quadrature couplers are not capable of being adjusted to compensate for component value variability, age-related component value drift, or other performance variables that may be experienced once the coupler is in the field. The limited bandwidth and lack of adjustability of conventional quadrature couplers limits their performance. Accordingly, what are needed are apparatus and methods for enabling higher bandwidth, adjustable quadrature couplers.

SUMMARY

Embodiments of quadrature couplers and methods of their operation are disclosed. An embodiment of a quadrature coupler includes first, second, third, and fourth ports, first, second, third, and fourth inductors, and first, second, third, fourth, fifth, and sixth capacitors. The first, second, and third capacitors are coupled in series between the first port and the fourth port, with a first intermediate node between the first and second capacitors, and with a second intermediate node between the second and third capacitors. The fourth, fifth, and sixth capacitors are coupled in series between the second port and the third port, with a third intermediate node between the fourth and fifth capacitors, and with a fourth intermediate node between the fifth and sixth capacitors. The first inductor is coupled between the first port and the second port, the second inductor is coupled between the first intermediate node and the third intermediate node, the third inductor is coupled between the second intermediate node and the fourth intermediate node, and the fourth inductor is coupled between the fourth port and the third port. The first, third, fourth, and sixth capacitors each may have a first capacitance value, and the second and fifth capacitors each may have a second capacitance value that is different from the first capacitance value. The first and fourth inductors each may have a first inductance value, and the second and third inductors each may have a second inductance value that is different from the first inductance value.

According to a further embodiment, the quadrature coupler further includes a first variable tuning network coupled between the first port and the fourth port, and a second variable tuning network coupled between the second port and the third port. The first variable tuning network and the second variable tuning network tune a coupling factor of the quadrature coupler. Each of the first and second variable tuning networks includes one or more variable reactance components or switched capacitors. The first variable tuning network and the second variable tuning network may be controllable to have a same capacitance value at any given time.

An embodiment of a method of operating a quadrature coupler that has first, second, third, and fourth ports includes controlling a capacitance value of a first variable tuning network that is coupled between the first port and the fourth port to tune a coupling factor of the quadrature coupler, and controlling a capacitance value of a second variable tuning network that is coupled between the third port and the fourth port to tune the coupling factor of the quadrature coupler. The first variable tuning network includes a first capacitor, and the second variable tuning network includes a second capacitor.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, the same reference numbers may be used to identify similar elements.

DETAILED DESCRIPTION

Figure 1:
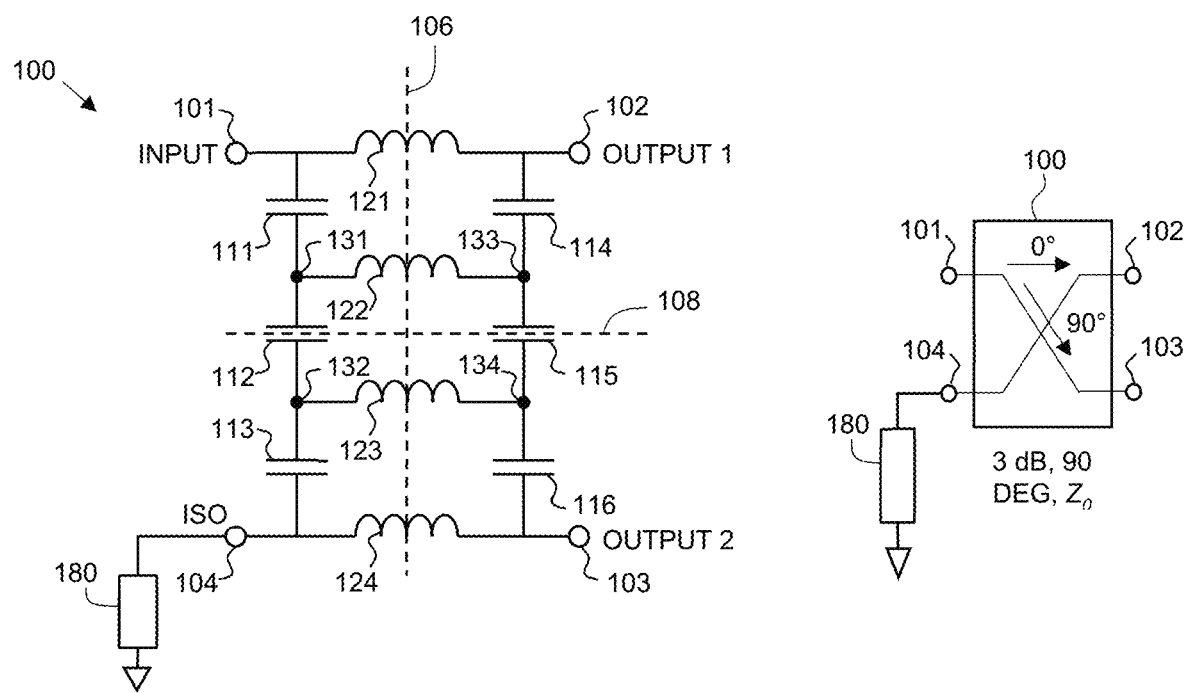
FIG. 1 illustrates a circuit diagram of a quadrature coupler, according to an example embodiment.

Embodiments of quadrature couplers described herein may be used in various types of RF circuits, including power amplifier circuits. For example, the various described embodiments are well suited to be used in RF power amplifiers to provide RF signal amplitude splitting, phase differential, and high isolation between output ports (e.g., between the direct and coupled ports).

The quadrature coupler embodiments disclosed herein may have certain advantages over conventional quadrature couplers. For example, embodiments of quadrature couplers described herein are based on a unique architecture, which enables a wider bandwidth of operation, when compared with other known quadrature couplers. As will be described in detail below, the unique architecture includes four parallel-coupled inductances, and six capacitances coupled between the parallel-coupled inductances.

In one or more further embodiments, a quadrature coupler may include tuning circuitry that enables the coupling factor, K, to be changed over a range of several decibels (dB), while the port return loss and the desired 90 degree phase difference between the direct and coupled ports may remain substantially unchanged. In other words, the phase difference between the signals at the direct and coupled ports may remain at 90 degrees despite adjustments being made to the variable coupling factor. This enables the quadrature couplers to be tuned during operation to compensate for component value variability and age-related component value drift, among other variables. According to some embodiments, the coupling factor can be varied electronically, such as through a digital interface (e.g., a serial peripheral interface, SPI).

The tuning circuitry described herein enables the quadrature coupler embodiments to be used to provide both symmetric coupling (i.e., where the power provided to both output ports is equal) and asymmetric coupling (i.e., where the power provided to both output ports is unequal).

Each embodiment of a quadrature coupler described herein has four ports, including an input port (referred to herein as "input port"), a direct port (referred to herein as "direct port" or "first output port"), a coupled port (referred to herein as "coupled port" or "second output port"), and an isolated port (referred to herein as "isolated port"). According to one or more embodiments, a quadrature coupler may also include six fixed-value capacitive elements (e.g., a first capacitor, a second capacitor, a third capacitor, a fourth capacitor, a fifth capacitor, and a sixth capacitor) and four fixed-value inductive elements (e.g., a first inductor, a second inductor, a third inductor, and a fourth inductor), which are electrically coupled in arrangements that will be described in more detail later.

The capacitance values of the capacitive elements and the inductance values of the inductive elements at least partially determine the coupling factor, K, of each quadrature coupler embodiment. As an example, the coupling factor may be defined as a ratio of input power (at the input port) to coupled power (at the direct or coupled port). For example, the coupling factor may be between, 0 decibels (dB) and −<<0 dB, and the coupling factor may be defined by:

$$K = 10 * \log_{10}\left[\frac{p_{coupled}}{p_{input}}\right] \quad \text{(equation 1)}$$

where K represents the coupling factor, $p_{coupled}$ represents an amount of power transferred to the direct/coupled port, and $p_{input}$ represents an amount of power transferred from the input port. Conventional quadrature couplers generally are limited to a static (e.g., constant) coupling factor. As mentioned previously, one or more embodiments include tuning circuitry that enables the coupling factor to be varied.

The fixed-value components of the quadrature coupler embodiments may be implemented using discrete capacitors and/or inductors (e.g., chip components), and/or using integrated capacitors and/or inductors (e.g., capacitors/inductors that are formed monolithically in a semiconductor die). Either way, in contrast with many conventional couplers, the quadrature coupler embodiments described herein utilize only non-resistive components (e.g., capacitors and inductors), which avoids attenuation and resistive losses that are inherent in other conventional couplers.

Embodiments of quadrature couplers described herein may be implemented in power amplifiers at an amplifier input, between amplification stages, and/or at an amplifier output. For example, in a power amplifier, an input signal (e.g., an input RF signal) may be provided to the input port of an embodiment of a quadrature coupler. The quadrature coupler is configured to divide the power of the input RF signal into two RF signals with equal or unequal power (depending on the coupling factor), apply phase shifts to the two RF signals (e.g., to achieve about a 90-degree phase difference between the signals), and provide the two RF signals to two output ports (e.g., to the direct port and the coupled port). The quadrature coupler is designed so that the isolated port does not receive any significant RF power.

FIG. 1 depicts an example of a quadrature coupler 100, in accordance with an embodiment of the invention. As will be described in more detail below, the quadrature coupler 100 includes only fixed-value components, and therefore the quadrature coupler 100 may be referred to herein as a "fixed" quadrature coupler.

Quadrature coupler 100 includes four ports, implemented as an input port 101 (or first port), a first output port 102 (or a second port or direct port), a second output port 103 (or a third port or coupled port), and an isolated port 104 (or a fourth port). As indicated in the simplified circuit equivalent of coupler 100 on the right side of FIG. 1, the quadrature coupler 100 is configured to receive an input RF signal at the input port 101, divide the power of the input RF signal into first and second output RF signals, implement a 90 degree phase shift between the first and second output RF signals, and transfer the phase-shifted, first and second output RF signals to first and second output ports 102, 103.

More specifically, in an embodiment, the input port 101 is configured to receive an input RF signal that is characterized by a signal power. The quadrature coupler 100 is configured to transfer a first portion of the input signal power to the first output port 102 with essentially zero relative phase shift, and to transfer a second portion of the input signal power to the second output port 103 with about 90 degrees of phase shift, with respect to the signal transferred to the first output port 102. In an embodiment, the first output port 102 is configured to receive the first portion of the input signal power transferred from the input port 101, and the second output port 103 is configured to receive the second portion of the input signal power transferred from the input port 101. Further, the quadrature coupler 100, is configured so that the isolated port 104 does not receive any significant power from the input port 101. According to one or more embodiments, the isolated port 104 is coupled to ground (e.g., through resistor 180).

According to one or more embodiments, the quadrature coupler 100 includes six fixed-value capacitors, implemented as a first capacitor 111, a second capacitor 112, a third capacitor 113, a fourth capacitor 114, a fifth capacitor 115, and a sixth capacitor 116. The quadrature coupler 100 also includes four fixed-value inductors, implemented as a first inductor 121, a second inductor 122, a third inductor 123, and a fourth inductor 124.

The first, second, and third capacitors 111, 112, 113 are coupled in series between the first port 101 and the fourth port 104, with a first intermediate node 131 between the first and second capacitors 111, 112, and with a second intermediate node 132 between the second and third capacitors 112, 113. The fourth, fifth, and sixth capacitors 114, 115, 116 are coupled in series between the second port 102 and the third port 103, with a third intermediate node 133 between the fourth and fifth capacitors 114, 115, and with a fourth intermediate node 134 between the fifth and sixth capacitors 115, 116.

The first inductor 121 is coupled between the first port 101 and the second port 102. The second inductor 122 is coupled between the first intermediate node 131 and the third intermediate node 133. The third inductor 123 is coupled between the second intermediate node 132 and the fourth intermediate node 134. The fourth inductor 124 is coupled between the fourth port 104 and the third port 103.

The various fixed-value capacitors 111-116 and fixed-value inductors 121-124 have capacitance and inductance values, respectively, that are selected based upon the desired frequency of operation of the circuit (e.g., amplifier) within which the quadrature coupler 100 is included. In addition, the fixed component values may be chosen to ensure "symmetry" of the quadrature coupler. To illustrate, FIG. 1 shows two lines of symmetry 106, 108 bisecting the components of the quadrature coupler 100. The first (vertical) line of symmetry 106 bisects the centers of inductive elements 121-124, indicating that half of the inductance of each inductive element 121-124 is on the left side of line 106, and the other half of the inductance of each inductive element 121-124 is on the right side of line 106. In addition, the capacitance value is the same for each pair of opposing capacitors (i.e., capacitors 111, 114 have the same value as each other; capacitors 112, 115 have the same value as each other; and capacitors 113, 116 have the same value as each other).

The second (horizontal) line of symmetry 108 bisects the centers of capacitive elements 112, 115, indicating that half of the capacitance of each capacitive element 112, 115 is above the line 108, and the other half of the capacitance of each capacitive element 112, 115 is below the line 108. In addition, the capacitance value is the same for each pair of opposing capacitors (i.e., capacitors 111, 113 have the same value as each other; and capacitors 114, 116 have the same value as each other). Finally, the inductance value is the same for each pair of opposing inductors (i.e., inductors 121, 124 have the same value as each other; and inductors 122, 123 have the same value as each other). These symmetry relationships lead to the following relative values for capacitors 111-116 and inductors 121-124 (capacitor and inductor reference numbers are indicated by the subscripts):

$C_{111}=C_{113}=C_{114}=C_{116}=C_A$
$C_{112}=C_{115}=C_B$
$L_{121}=L_{124}=L_A$
$L_{122}=L_{123}=L_B$ where $C_A$ is a first capacitance value; $C_B$ is a second capacitance value that may be the same or different from the value of $C_A$; $L_A$ is a first inductance value; and $L_B$ is a second inductance value that may be the same or different from the value of $L_A$. Essentially, the capacitance and inductance values are symmetrical across the vertical and horizontal lines of symmetry 106, 108, according to one or more embodiments. In other embodiments, the capacitance and inductance values may be asymmetric (e.g., $C_{111} \neq C_{113}$, $L_{121} \neq L_{124}$, and so on). As used herein, the operator "=" and the terms "equal" and "substantially equal" means that two values are exactly equal or that two values are within 5 percent of each other. On the other hand, the operator "≠" and the term "unequal" means that two values are at least 5 percent different from each other.

The six capacitors 111-116 and four inductors 121-124 have values that are selected to achieve the desired coupling factor, K, of the quadrature coupler 100. In some embodiments, the component values are selected so that the coupler 100 has a coupling factor of $10*\log_{10}[0.5]$, meaning that the input signal power is divided evenly between the first and second output ports 102, 103. In other embodiments, the component values are selected to have a different coupling factor, meaning that the input signal power is divided unevenly between the first and second output ports 102, 103. For example, a coupling factor of $10*\log_{10}[0.67]$ could correspond to the first output port 102 receiving a signal with about half the power than the signal that is received by the second output port 103.

According to one or more embodiments, assuming a center frequency of operation of about 3.5 gigahertz and a system impedance of about 50 ohms, $C_A$ may be in a range of about 0.7 picofarads (pF) to about 1.7 pF, $C_B$ may be in a range of about 0.3 pF to about 1.3 pF. $L_A$ may be in a range of about 2.1 nanohenries (nH) to about 3.1 nH, and $L_B$ may be in a range of about 2.9 nH to about 3.9 nH. Generally, $C_A > C_B$ and $L_A < L_B$, in some embodiments. As used herein, the operator ">" means at least 5 percent greater than, and the operator "<" means at least 5 percent less than. The values of $C_A$, $C_B$, $L_A$, and $L_B$ may be smaller and/or larger than the above-given ranges, and/or the relative values of $C_A$, $C_B$, $L_A$, and $L_B$ may be different than indicated above, in other embodiments, and particularly when the center frequency of operation and/or the system impedance is different from the example given above.

In "fixed" quadrature coupler of FIG. 1, the coupling factor, K, is fixed by virtue of the various capacitors 111-116 and inductors 121-124 having fixed values. According to other embodiments, the coupling factor may be variable. As will be explained in detail below, this is achievable by coupling variable tuning networks to the quadrature coupler. For example, FIGS. 2A, 2B, and 2C illustrate embodiments of quadrature couplers 200, 200', 200" that include first and second variable tuning networks 240, 240', 240", 250, 250', 250" coupled between the various intermediate nodes 131-134 of the quadrature couplers 200, 200', 200".

Figure 2A:
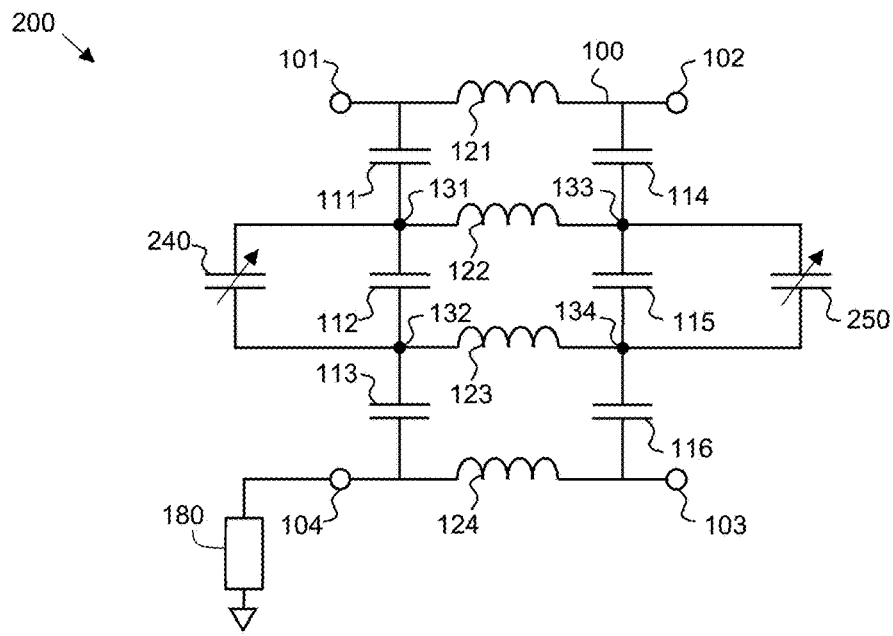
FIGS. 2A, 2B, and 2C illustrate circuit diagrams of quadrature couplers with variable capacitance circuits coupled between intermediate nodes, according to various example embodiments.
Figure 2B:
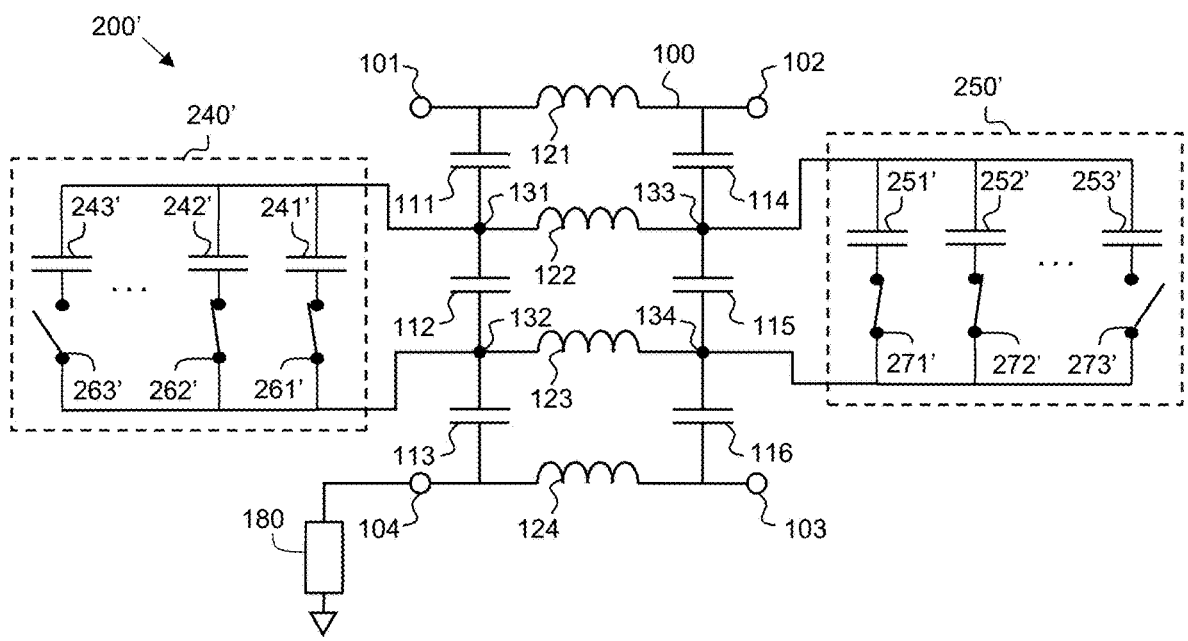
Figure 2C:
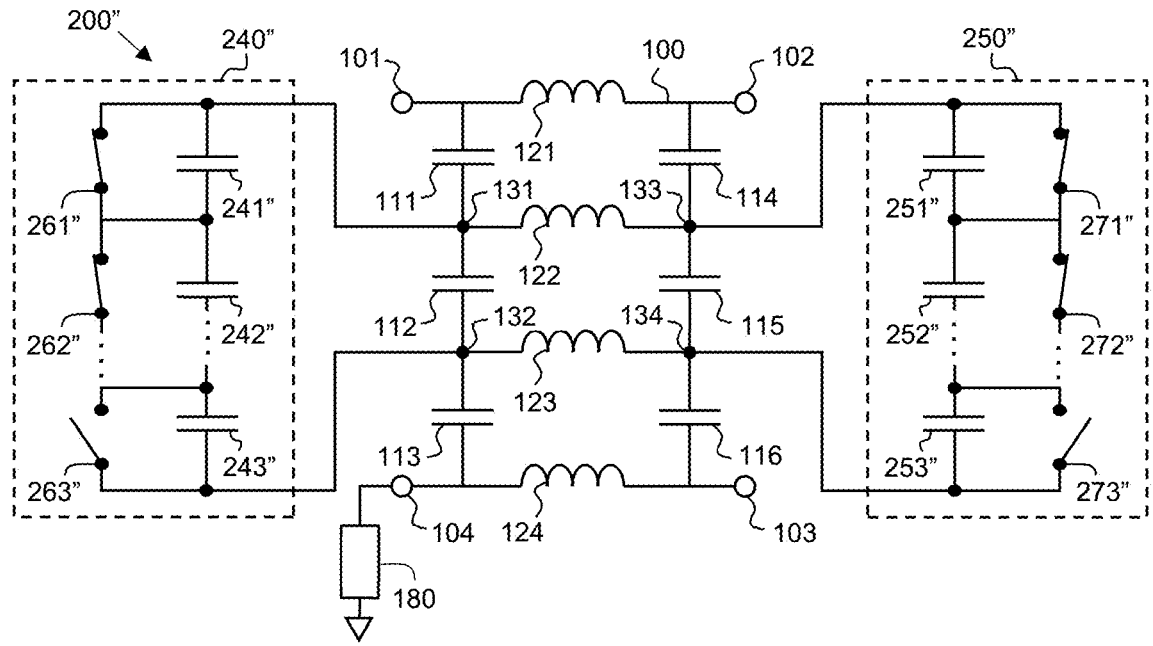

Each of the quadrature couplers 200, 200', 200" shown in FIGS. 2A-2C include a fixed quadrature coupler 100 (i.e., a quadrature coupler with a fixed coupling factor, K. and with fixed-value components), which has the same essential structure as coupler 100 (FIG. 1). Again, fixed quadrature coupler 100 includes four ports 101-104, six fixed-value capacitors 111-116, four fixed-value inductors 121-124, and four intermediate nodes 131-134, which are arranged as shown in FIGS. 1 and 2A-2C. The fixed quadrature coupler 100 functions as described above in conjunction with FIG. 1, and the values of the various components 111-116, 121-124 may be selected in a manner also described above in conjunction with FIG. 1. The details regarding the structure, component values, and operation of quadrature coupler 100 described above in conjunction with FIG. 1 are incorporated into the below descriptions of FIGS. 2A, 2B, and 2C.

Starting first with FIG. 2A, an embodiment of a quadrature coupler 200 is shown that includes a fixed quadrature coupler 100, a first variable tuning network 240 coupled between intermediate nodes 131 and 132, and a second variable tuning network 250 coupled between intermediate nodes 133 and 134. Essentially, the variable tuning networks 240, 250 are controllable to modify the capacitances, and thus the coupling factor, K, of the quadrature coupler 200.

The first variable tuning network 240 includes a first variable capacitance circuit with a first terminal coupled or connected to intermediate node 131, and a second terminal coupled or connected to intermediate node 132. Similarly, the second variable tuning network 250 includes a second variable capacitance circuit with a first terminal coupled or connected to intermediate node 133, and a second terminal coupled or connected to intermediate node 134. In other words, the first variable tuning network 240 is connected in parallel with fixed-value capacitor 112, and the second variable tuning network 250 is connected in parallel with fixed-value capacitor 115.

The variable tuning networks 240, 250 may be implemented in various ways. For example, as will be described in conjunction with FIGS. 2B and 2C, each variable tuning network 240, 250 may be implemented with a switched capacitor bank. In other embodiments, each variable tuning network 240, 250 could be implemented with one or more variable capacitors or other non-linear reactance components. For example, each variable tuning network 240, 250 may be implemented using one or more varactors, varicap diodes, and/or passive tunable integrated circuits (PTICs), where the capacitance value is adjustable based on a voltage applied to or across the component(s). As a more specific embodiment, a PTIC may be used that includes a variable capacitor with a barium strontium titanate (BST) dielectric layer.

During operation, the states of the variable tuning networks 240, 250 are controlled to tune the coupling factor of the quadrature coupler 200. To tune the coupling factor, the capacitance of each of the first and second variable tuning networks 240, 250 may be adjusted based on receipt of one or more control signals. For example, as will be discussed later in conjunction with FIG. 4, quadrature coupler 200 may be included on a module or substrate that also includes a digital interface (e.g., digital interface 490, FIG. 4), such as a serial peripheral interface (SPI). The digital interface may receive digital control signals from another source (e.g., a system controller), the digital control signals may be processed (e.g., by controller 470, FIG. 4) to produce analog control signals (e.g., voltage signals), and the analog control signals may be provided to the variable tuning networks 240, 250. The analog control signals may cause the variable tuning networks 240, 250 to modify their capacitance values, resulting in a modification of the coupling factor, K, of the quadrature coupler 200.

According to one or more embodiments, the first and second variable tuning networks 240, 250 are controlled synchronously to have substantially equal capacitance values at any given time. This maintains the vertical symmetry of the quadrature coupler 200 (e.g., symmetry across line 106, FIG. 1). Essentially, the values of the fixed-value capacitors 111-116 and the fixed-value inductors 121-124 remain the same, while the capacitance of the first and second variable tuning networks 240, 250 are synchronously changed to adjust the coupling factor, K, of the quadrature coupler 200.

In other embodiments, as shown in FIGS. 2B and 2C, the first and second variable tuning networks may be implemented using switched capacitor circuits. For example, referring to FIG. 2B, an embodiment of a quadrature coupler 200' is shown that includes a fixed quadrature coupler 100, a first variable tuning network 240' coupled between intermediate nodes 131 and 132, and a second variable tuning network 250' coupled between intermediate nodes 133 and 134. As will be explained below, the first and second variable tuning networks 240', 250' each include multiple capacitance units, where each unit includes a capacitor 241'-243', 251'-253' in series with a switching element 261'-263', 271'-273'. Again, the variable tuning networks 240', 250' are controllable to modify the capacitances, and thus the coupling factor, K, of the quadrature coupler 200'.

The first variable tuning network 240' includes a first variable capacitance circuit, and the second variable tuning network 250' includes a second variable capacitance circuit. According to an embodiment, the first variable tuning network 240' includes a first terminal coupled or connected to intermediate node 131, a second terminal coupled or connected to intermediate node 132, and a number, N, of capacitance units coupled in parallel between the first and second terminals. Similarly, the second variable tuning network 250' includes a first terminal coupled or connected to intermediate node 133, a second terminal coupled or connected to intermediate node 134, and the number, N, of capacitance units coupled in parallel between the first and second terminals. Essentially, the first variable tuning network 240' is connected in parallel with fixed-value capacitor 112, and the second variable tuning network 250' is connected in parallel with fixed-value capacitor 115.

In the embodiment illustrated in FIG. 2B, each of the first and second variable tuning networks 240', 250' includes three, parallel-coupled capacitance units (i.e., N=3). However, in other embodiments, N may be less than three (e.g., N may be as small as one), or N may be greater than three (e.g., N may be as large as ten or more).

Each of the capacitance units in the first and second variable tuning networks 240', 250' includes a capacitor 241', 242', 243', 251', 252', 253' coupled in series with a switching element 261', 262', 263', 271', 272', 273'. For example, each capacitor 241'-243', 251'-253' may include a metal insulator metal (MIM) capacitor, a metal oxide semiconductor (MOS) capacitor, or another suitable type of capacitor. Each switching element 261'-263', 271'-273' may be a field effect transistor (FET) (e.g., an insulated gate FET, a metal oxide semiconductor FET (MOS FET), a fin FET, and so on), a complementary metal-oxide-semiconductor (CMOS) transistor, a bipolar junction transistor (BJT), a mechanical switch, or another suitable type of switching element. Desirably, each switching element 261'-263', 271'-273' has a minimal effect on performance with a resistance of 1 ohm to 2 ohms to minimize losses.

During operation, the states of the switching elements 261'-263', 271'-273' are controlled to tune the coupling factor of the quadrature coupler 200'. To tune the coupling factor, the capacitance of each of the first and second variable tuning networks 240', 250' may be adjusted based on receipt of one or more control signals, as mentioned previously. More specifically, each of the switching elements 261'-263', 271'-273' is configured to receive a switch control signal (e.g., from controller 470, FIG. 4). Based on the value of the switch control signal (e.g., low voltage or high voltage), each switching element 261'-263', 271'-273' will be configured into a high impedance state (e.g., open circuit) or a low impedance state (e.g., short circuit). When a switching element 261'-263', 271'-273' is in a high impedance state, little or no current will flow through that capacitance unit, and the capacitor 241'-243', 251'-253' to which the switching element is coupled will not contribute to the overall capacitance of the variable tuning network 240', 250'. Conversely, when a switching element 261'-263', 271'-273' is in a low impedance state, current will flow through that capacitance unit, and the capacitor 241'-243', 251'-253' to which the switching element is coupled will contribute to the overall capacitance of the variable tuning network 240', 250'.

Essentially, the overall capacitance of each variable tuning network 240', 250' approximately equals the sum of the capacitance values of all parallel-coupled capacitors 241'-243', 251'-253' that are coupled to a switching element 261'-263', 271'-273' that is in a low impedance state.

As mentioned previously, according to one or more embodiments, the first and second variable tuning networks 240', 250' are controlled synchronously to have substantially equal capacitance values at any given time, in order to maintain vertical symmetry of the quadrature coupler 200'. For example, synchronized control signals may be provided to the switching elements 261'-263', 271'-273' to ensure that the first and second variable tuning networks 240', 250' are configured to have the same overall capacitance at any given time. The switching element 261'-263', 271'-273' are controlled synchronously to adjust the overall capacitance values of the first and second variable tuning networks 240', 250', and thus to adjust the coupling factor, K, of the quadrature coupler 200'.

According to some embodiments, the minimum overall capacitance value of each of the first and second variable tuning networks 240', 250' is zero pF, and the maximum overall capacitance value of each of the first and second variable tuning networks 240', 250' is in a range of about 0.2 pF to about 0.6 pF (e.g., about 0.4 pF). In addition, the capacitance value of each capacitor 241'-243', 251'-253' may be in a range of about 0.05 pF to about 0.5 pF. The overall or individual capacitance values may be lower or higher than the above-given ranges, in other embodiments.

In some embodiments, the capacitance values of each of the capacitors 241'-243', 251'-253' are substantially equal. For example, in an embodiment in which each of the first and second variable tuning networks 240', 250' have three capacitance units, and the maximum overall capacitance of each of the first and second variable tuning networks 240', 250' is 0.3 pF, each capacitor 241'-243', 251'-253' may have a capacitance value of 0.1 pF. In such an embodiment, each of the first and second variable tuning networks 240', 250' may have one of four capacitance values at any given time. More specifically, if each of the capacitors 241'-243', 251'-253' has a capacitance value of "C", at any given time, the overall capacitance value of a tuning network 240', 250' may be 0*C (when zero capacitors are switched into the tuning network), 1*C (when any 1 of the capacitors is switched into the tuning network), 2*C (when any 2 of the capacitors are switched into the tuning network), or 3*C (when all 3 capacitors are switched into the tuning network).

In one or more other embodiments, within each of the first and second variable tuning networks 240', 250', the capacitance values of each of the capacitors 241'-243', 251'-253' may be different. This enables each of the tuning networks 240', 250' to be configured in any one of M tuning states (M=$2^N$), each with a unique overall capacitance value. For example, in an embodiment in which each of the first and second variable tuning networks 240', 250' has three capacitance units (i.e., N=3), each of the tuning networks 240', 250' to be configured in any one of 8 tuning states. For example, capacitors 241' and 251' each may have a capacitance value of 1*C, capacitors 242' and 252' each may have a capacitance value of 2*C, and capacitors 243' and 253' each may have a capacitance value of 4*C. By selectively switching the capacitors 241'-243', 251'-253' into or out of each network 240', 250', the 8 possible tuning states can produce overall capacitance values for each network 240', 250' of 0*C, 1*C, 2*C, 3*C, 4*C, 5*C, 6*C, or 7*C.

Referring now to the embodiment illustrated in FIG. 2C, another embodiment of a quadrature coupler 200" is shown that includes a fixed quadrature coupler 100, a first variable tuning network 240" coupled between intermediate nodes 131 and 132, and a second variable tuning network 250" coupled between intermediate nodes 133 and 134. Each of the first and second variable tuning networks 240", 250" includes three, series-coupled capacitance units (i.e., N=3). However, in other embodiments, N may be less than three (e.g., N may be as small as one), or N may be greater than three (e.g., N may be as large as ten or more).

Each of the capacitance units in the first and second variable tuning networks 240". 250" includes a capacitor 241". 242". 243", 251", 252", 253" coupled in parallel with a switching element 261". 262", 263", 271", 272", 273". For example, each capacitor 241"-243", 251"-253" may include a MIM capacitor, a MOS capacitor, or another suitable type of capacitor. Each switching element 261"-263", 271"-273" may be a FET, a CMOS transistor, a BJT, a mechanical switch, or another suitable type of switching element. Desirably, each switching element 261"-263", 271"-273" has a minimal effect on performance with a resistance of 1 ohm to 2 ohms to minimize losses.

During operation, the states of the switching elements 261"-263", 271"-273" are controlled to tune the coupling factor of the quadrature coupler 200". To tune the coupling factor, the capacitance of each of the first and second variable tuning networks 240", 250" may be adjusted based on receipt of one or more control signals, as mentioned previously. More specifically, each of the switching elements 261"-263", 271"-273" is configured to receive a switch control signal (e.g., from controller 470, FIG. 4). Based on the value of the switch control signal (e.g., low voltage or high voltage), each switching element 261"-263", 271"-273" will be configured into a high impedance state (e.g., open circuit) or a low impedance state (e.g., short circuit). When a switching element 261"-263", 271"-273" is in a high impedance state, a voltage will be induced across the capacitor 241"-243", 251"-253" that is coupled in parallel with the high-impedance switching element, and that capacitor will contribute to the overall capacitance of the variable tuning network 240". 250". Conversely, when a switching element 261"-263", 271"-273" is in a low impedance state, a voltage will not be induced across the capacitor 241"-243", 251"-253" that is coupled in parallel with the low-impedance switching element. Instead, the current flowing through the variable tuning network 240", 250" will bypass that capacitor through the low-impedance switching element, and the capacitor 241"-243", 251"-253" to which the switching element is coupled will not contribute to the overall capacitance of the variable tuning network 240", 250". The overall capacitance of each variable tuning network 240", 250" can be calculated by applying the series capacitor formula to those capacitors that are not bypassed (i.e., if series-coupled capacitors C1, C2, C3 are not bypassed, the overall capacitance can be calculated as 1/C1+1/C2+1/C3).

As mentioned previously, according to one or more embodiments, the first and second variable tuning networks 240", 250" are controlled synchronously to have substantially equal capacitance values at any given time, in order to maintain vertical symmetry of the quadrature coupler 200". For example, synchronized control signals may be provided to the switching elements 261"-263", 271"-273" to ensure that the first and second variable tuning networks 240", 250" are configured to have the same overall capacitance at any given time. The switching element 261"-263", 271"-273" are controlled synchronously to adjust the overall capacitance values of the first and second variable tuning networks 240", 250", and thus to adjust the coupling factor, K, of the quadrature coupler 200".

According to some embodiments, the minimum overall capacitance value of each of the first and second variable tuning networks 240", 250" is zero pF, and the maximum overall capacitance value of each of the first and second variable tuning networks 240". 250" is in a range of about 0.2 pF to about 0.6 pF (e.g., about 0.4 pF). In addition, the capacitance value of each capacitor 241"-243", 251"-253" may be in a range of about 0.05 pF to about 0.5 pF. The overall or individual capacitance values may be lower or higher than the above-given ranges, in other embodiments.

In some embodiments, the capacitance values of each of the capacitors 241"-243", 251"-253" are substantially equal. For example, in an embodiment in which each of the first and second variable tuning networks 240". 250" have three capacitance units, and the maximum overall capacitance of each of the first and second variable tuning networks 240", 250" is 0.3 pF, each capacitor 241"-243", 251"-253" may have a capacitance value of 0.1 pF. In such an embodiment, each of the first and second variable tuning networks 240", 250" may have one of four capacitance values at any given time. More specifically, if each of the capacitors 241"-243". 251"-253" has a capacitance value of "C", at any given time, the overall capacitance value of a tuning network 240", 250" may be 0*C (when all capacitors are bypassed), 1*C (when any 2 of the capacitors are bypassed), C/2 (when any 1 of the capacitors are bypassed), or C/3 (when none of the capacitors are bypassed).

In one or more other embodiments, within each of the first and second variable tuning networks 240", 250", the capacitance values of each of the capacitors 241"-243", 251"-253" may be different. This enables each of the tuning networks 240", 250" to be configured in any one of M tuning states (M=2N), each with a unique overall capacitance value. For example, in an embodiment in which each of the first and second variable tuning networks 240". 250" has three capacitance units (i.e., N=3), each of the tuning networks 240", 250" to be configured in any one of 8 tuning states. For example, capacitors 241" and 251" each may have a capacitance value of 1*C, capacitors 242" and 252" each may have a capacitance value of 2*C, and capacitors 243" and 253" each may have a capacitance value of 4*C. By selectively switching the capacitors 241"-243", 251"-253" into or out of each network 240", 250", the 8 possible tuning states can produce overall capacitance values for each network 240", 250" of 0*C. 1*C, 2*C, (2*C)/(3*C), 4*C. (4*C)/(5*C), (8*C)/(6*C), or (8*C)/(7*C).

In the embodiments of FIGS. 2A-2C, the variable tuning networks 240, 240', 240", 250, 250', 250" are coupled to or connected to the intermediate nodes 131-134. In other embodiments, such as those shown in FIGS. 3A, 3B, and 3C, variable tuning networks 240, 240', 240", 250, 250', 250" instead are coupled to or connected to the ports 101-104 of the quadrature couplers 300, 300', 300". More specifically, FIGS. 3A, 3B, and 3C illustrate embodiments of quadrature couplers 300, 300', 300" that include first and second variable tuning networks 240, 240', 240", 250, 250', 250" coupled between the various ports 101-104 of the quadrature couplers 300, 300', 300".

Figure 3A:
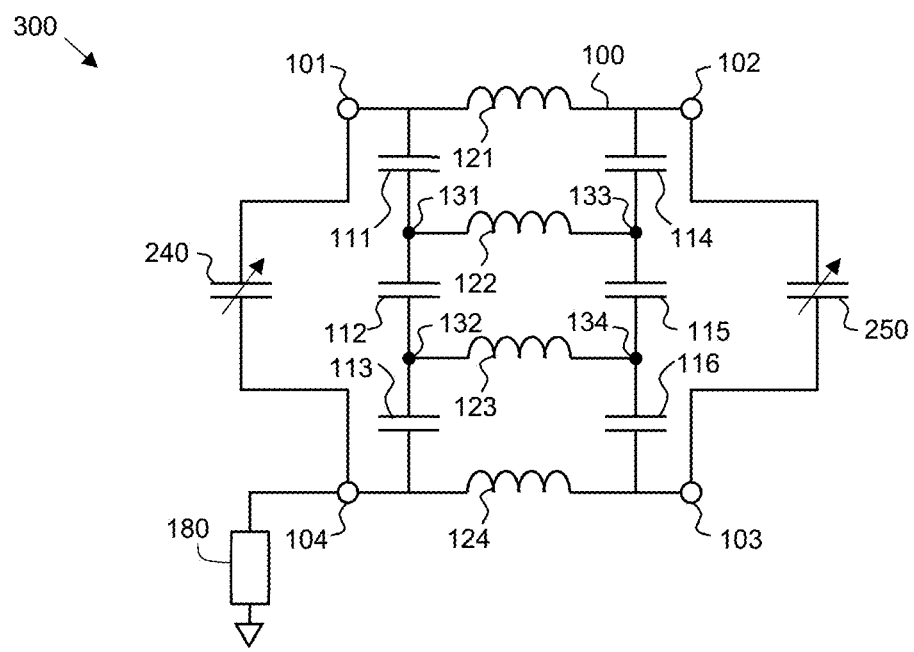
FIGS. 3A, 3B, and 3C illustrate circuit diagrams quadrature couplers with variable capacitance circuits coupled between coupler ports, according to various additional example embodiments.
Figure 3B:
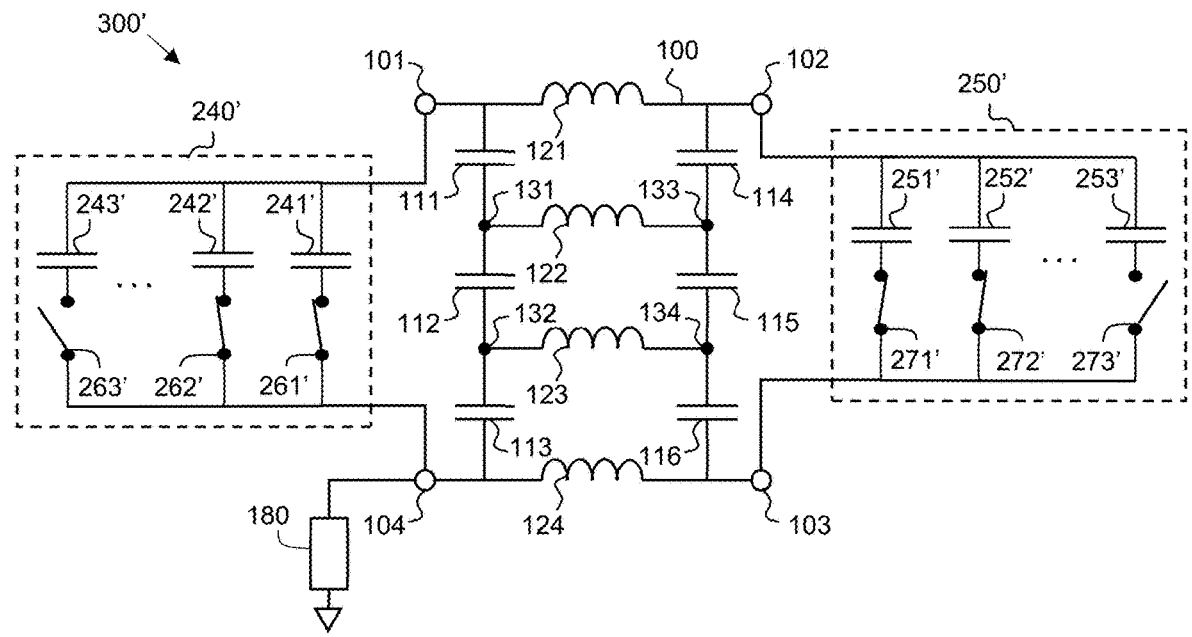
Figure 3C:
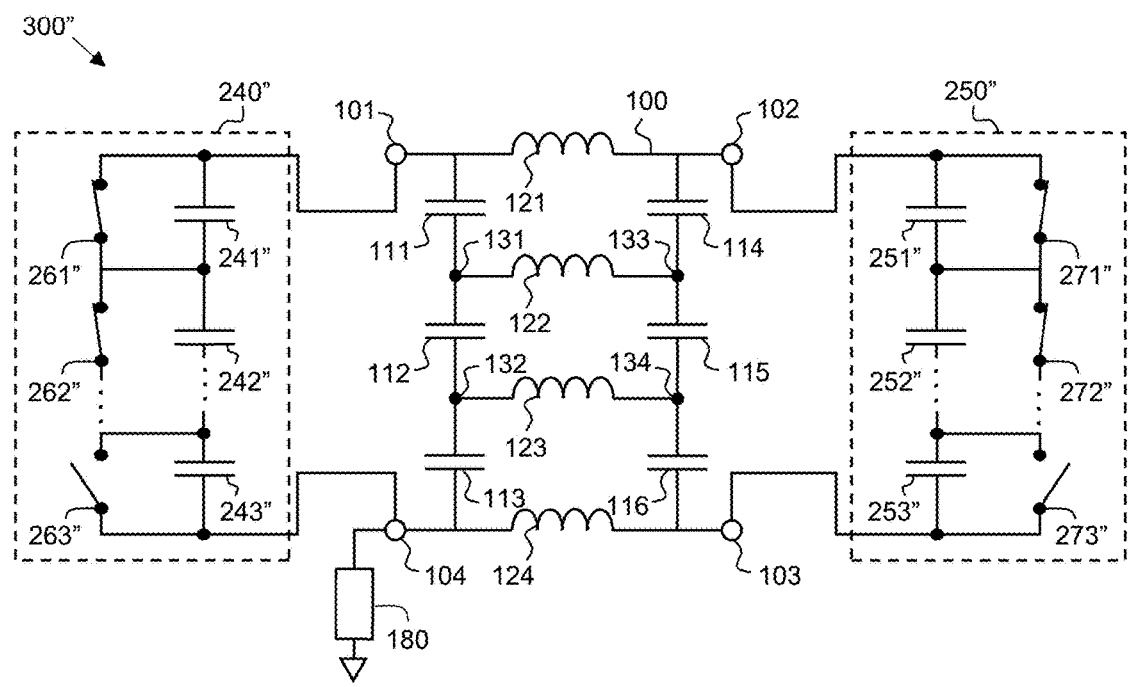

Each of the quadrature couplers 300, 300', 300" shown in FIGS. 3A-3C include a fixed quadrature coupler 100 (i.e., a quadrature coupler with a fixed coupling factor, K, and with fixed-value components), which has the same essential structure as coupler 100 (FIG. 1). Again, fixed quadrature coupler 100 includes four ports 101-104, six fixed-value capacitors 111-116, four fixed-value inductors 121-124, and four intermediate nodes 131-134, which are arranged as shown in FIGS. 1 and 3A-3C. The fixed quadrature coupler 100 functions as described above in conjunction with FIG. 1, and the values of the various components 111-116, 121-124 may be selected in a manner also described above in conjunction with FIG. 1. The details regarding the structure, component values, and operation of quadrature coupler 100 described above in conjunction with FIG. 1 are incorporated into the below descriptions of FIGS. 3A, 3B, and 3C.

Starting first with FIG. 3A, an embodiment of a quadrature coupler 300 is shown that includes a fixed quadrature coupler 100, a first variable tuning network 240 coupled between ports 101 and 104, and a second variable tuning network 250 coupled between ports 102 and 103. Essentially, the variable tuning networks 240, 250 are controllable to modify the capacitances, and thus the coupling factor, K, of the quadrature coupler 300.

The first variable tuning network 240 includes a first variable capacitance circuit with a first terminal coupled or connected to port 101, and a second terminal coupled or connected to port 104. Similarly, the second variable tuning network 250 includes a second variable capacitance circuit with a first terminal coupled or connected to port 102, and a second terminal coupled or connected to port 103. In other words, the first variable tuning network 240 is connected in parallel with the series-coupled, fixed-value capacitors 111, 112, 113, and the second variable tuning network 250 is connected in parallel with the series-coupled, fixed-value capacitors 114, 115, 116.

The variable tuning networks 240, 250 may be implemented in various ways, as discussed in conjunction with FIGS. 2A-2C. For example, as will be described in conjunction with FIGS. 3B and 3C, each variable tuning network 240, 250 may be implemented with a switched capacitor bank. In other embodiments, each variable tuning network 240, 250 could be implemented with one or more variable capacitors or other non-linear reactance components. For example, as discussed previously, each variable tuning network 240, 250 may be implemented using one or more varactors, varicap diodes, and/or PTICs, where the capacitance value is adjustable based on a voltage applied to or across the component(s).

During operation, the states of the variable tuning networks 240, 250 may be controlled as discussed in conjunction with FIG. 2A to tune the coupling factor of the quadrature coupler 300. The details associated with controlling the variable tuning networks 240, 250 discussed above in conjunction with FIG. 2A apply also to quadrature coupler 300, and those details are incorporated into this discussion of FIG. 3A. In summary, control signals are provided to the variable tuning networks 240, 250, which cause the variable tuning networks 240, 250 to modify their capacitance values, resulting in a modification of the coupling factor, K, of the quadrature coupler 300. Again, the first and second variable tuning networks 240, 250 are controlled synchronously to have substantially equal capacitance values at any given time.

In other embodiments, as shown in FIGS. 3B and 3C, the first and second variable tuning networks may be implemented using switched capacitor circuits. For example, referring to FIG. 3B, an embodiment of a quadrature coupler 300' is shown that includes a fixed quadrature coupler 100, a first variable tuning network 240' coupled between ports 101 and 104, and a second variable tuning network 250' coupled between ports 102 and 103. As previously explained in conjunction with FIG. 2B, the first and second variable tuning networks 240', 250' each include multiple capacitance units, where each unit includes a capacitor 241', 242', 243', 251', 252', 253' in series with a switching element 261'-263', 271'-273'. Again, the variable tuning networks 240', 250' are controllable to modify the capacitances, and thus the coupling factor, K, of the quadrature coupler 300'.

The first variable tuning network 240' includes a first variable capacitance circuit, and the second variable tuning network 250' includes a second variable capacitance circuit. According to an embodiment, the first variable tuning network 240' includes a first terminal coupled or connected to port 101, a second terminal coupled or connected to port 104, and a number, N, of capacitance units coupled in parallel between the first and second terminals (e.g., 1≤N≤10 or more). Similarly, the second variable tuning network 250' includes a first terminal coupled or connected to port 102, a second terminal coupled or connected to port 103, and the number, N, of capacitance units coupled in parallel between the first and second terminals. Essentially, the first variable tuning network 240' is connected in parallel with fixed-value capacitors 111-113, and the second variable tuning network 250' is connected in parallel with fixed-value capacitors 114-116.

As discussed above in conjunction with FIG. 2B, each of the capacitance units in the first and second variable tuning networks 240', 250' includes a capacitor 241', 242', 243', 251', 252', 253' coupled in series with a switching element 261', 262', 263', 271', 272', 273'. The details regarding the structure, component values, and operation of the capacitors 241'-243', 251'-253' and switching elements 261'-263', 271'-273' described above in conjunction with FIG. 2B are incorporated into this description of FIG. 3B. For brevity, those details are not repeated here.

Again, during operation, the states of the switching elements 261'-263', 271'-273' are controlled to tune the coupling factor of the quadrature coupler 300'. To tune the coupling factor, the capacitance of each of the first and second variable tuning networks 240', 250' may be adjusted based on receipt of one or more control signals, as mentioned previously. The details regarding the control and operation of the switching elements 261'-263', 271'-273' described above in conjunction with FIG. 2B are incorporated into this description of FIG. 3B. For brevity, those details are not repeated here.

Referring now to the embodiment illustrated in FIG. 3C, another embodiment of a quadrature coupler 300" is shown that includes a fixed quadrature coupler 100, a first variable tuning network 240" coupled between ports 101 and 104, and a second variable tuning network 250" coupled between ports 102 and 103.

As previously explained in conjunction with FIG. 2C, the first and second variable tuning networks 240", 250" each include multiple capacitance units, where each unit includes a capacitor 241", 242", 243", 251", 252", 253" coupled in parallel with a switching element 261"-263", 271"-273". Again, the variable tuning networks 240", 250" are controllable to modify the capacitances, and thus the coupling factor, K, of the quadrature coupler 300".

The first variable tuning network 240" includes a first variable capacitance circuit, and the second variable tuning network 250" includes a second variable capacitance circuit. According to an embodiment, the first variable tuning network 240" includes a first terminal coupled or connected to port 101, a second terminal coupled or connected to port 104, and a number, N, of capacitance units coupled in series between the first and second terminals (e.g., 1≤N≤10 or more). Similarly, the second variable tuning network 250" includes a first terminal coupled or connected to port 102, a second terminal coupled or connected to port 103, and the number, N, of capacitance units coupled in series between the first and second terminals. Essentially, the first variable tuning network 240" is connected in parallel with fixed-value capacitors 111-113, and the second variable tuning network 250" is connected in parallel with fixed-value capacitors 114-116.

As discussed above in conjunction with FIG. 2C, each of the capacitance units in the first and second variable tuning networks 240", 250" includes a capacitor 241", 242", 243", 251", 252", 253" coupled in parallel with a switching element 261", 262", 263", 271", 272", 273". The details regarding the structure, component values, and operation of the capacitors 241"-243", 251"-253" and switching elements 261"-263", 271"-273" described above in conjunction with FIG. 2C are incorporated into this description of FIG. 3C. For brevity, those details are not repeated here.

Again, during operation, the states of the switching elements 261"-263", 271"-273" are controlled to tune the coupling factor of the quadrature coupler 300". To tune the coupling factor, the capacitance of each of the first and second variable tuning networks 240", 250" may be adjusted based on receipt of one or more control signals, as mentioned previously. The details regarding the control and operation of the switching elements 261"-263", 271"-273" described above in conjunction with FIG. 2C are incorporated into this description of FIG. 3C. For brevity, those details are not repeated here.

The switched-capacitor variable tuning networks 240', 240", 250', 250" illustrated in FIGS. 2B, 2C, 3B, and 3C and discussed above each include either "series" capacitance units in which each capacitor 241'-243', 251'-253' is coupled in series with a switching element 261'-263', 271'-273' (FIGS. 2B, 3B), or "parallel" capacitance units in which each capacitor 241"-243", 251"-253" is coupled in parallel with a switching element 261"-263", 271"-273" (FIGS. 2C, 3C). In other embodiments (not illustrated), variable tuning networks may be used that include combinations of series and parallel capacitance units. Such variations are intended to be included in the scope of the inventive subject matter.

Figure 4:
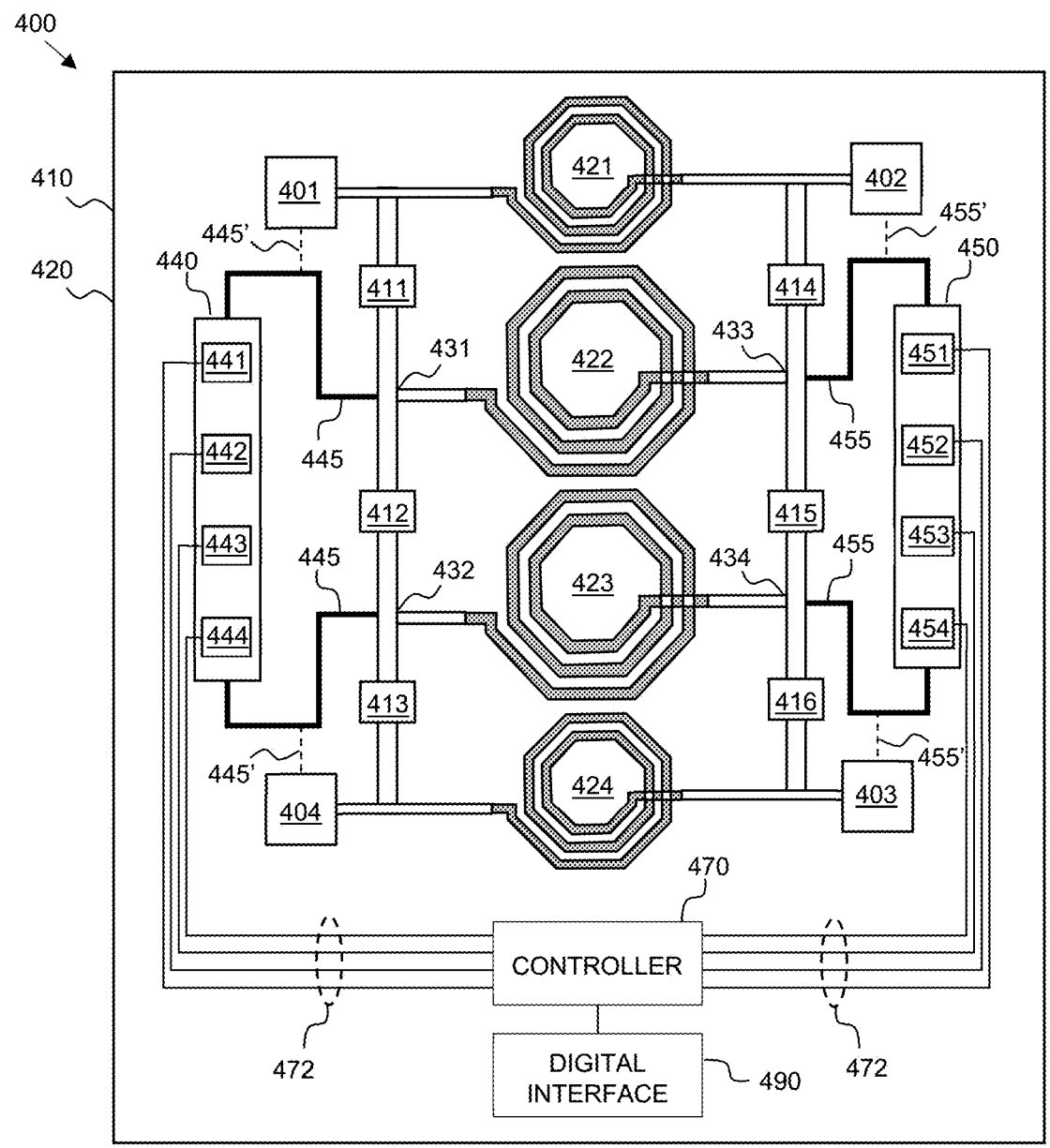
FIG. 4 illustrates a quadrature coupler formed in an integrated circuit, according to an example embodiment.

As mentioned previously, the various quadrature couplers 100, 200, 200', 200", 300, 300', 300" discussed above may be implemented in an integrated circuit. For example, FIG. 4 illustrates an "integrated" quadrature coupler 400 formed in an integrated circuit 410, according to an example embodiment.

The integrated circuit 410 includes a semiconductor substrate 420 within which or onto which the various components of the quadrature coupler 400 are integrated or connected. In various embodiments, the semiconductor substrate 420 may be a silicon (Si) based substrate (e.g., silicon, silicon-germanium (SiGe), silicon-on-insulator, and so on), a III-V based substrate (e.g., gallium-arsenide (GaAs), gallium-nitride (GaN), and so on), or another suitable type of semiconductor substrate.

The quadrature coupler 400 includes first, second, third, and fourth ports 401, 402, 403, 404 (e.g., ports 101-104, FIG. 1), which may be implemented as bondpads exposed at the top or bottom surface of the semiconductor substrate 420, for example. In addition, the quadrature coupler 400 includes first, second, third, fourth, fifth, and sixth fixed-value capacitors 411, 412, 413, 414, 415, 416, each of which may be implemented as an integrated capacitor within the semiconductor substrate 420 (e.g., a MIM or MOS capacitor). Through conductive traces or transmission lines of the semiconductor substrate 420, the first, second, and third capacitors 411-413 are coupled in series between the first port 401 and the fourth port 404, with first and second intermediate nodes 431, 432 between the capacitors. Through additional conductive traces or transmission lines of the semiconductor substrate 420, the fourth, fifth, and sixth capacitors 414-416 are coupled in series between the second port 402 and the third port 403, with a third and fourth intermediate nodes 433, 434 between the capacitors.

The quadrature coupler 400 also includes first, second, third, and fourth fixed-value inductors 421, 422, 423, 424, each of which may be implemented as an integrated spiral inductor on or within the semiconductor substrate 420, as illustrated. Through additional conductive traces or transmission lines of the semiconductor substrate 420, the first inductor 421 is coupled between the first port 401 and the second port 402. Through other additional conductive traces or transmission lines of the semiconductor substrate 420, the second inductor 422 is coupled between the first intermediate node 431 and the third intermediate node 433. Through other additional conductive traces or transmission lines of the semiconductor substrate 420, the third inductor 423 is coupled between the second intermediate node 432 and the fourth intermediate node 434. Through still other additional conductive traces or transmission lines of the semiconductor substrate 420, the fourth inductor 424 is coupled between the fourth port 404 and the third port 403.

The quadrature coupler 400 also includes first and second variable tuning networks 440, 450, according to an embodiment. Although the first and second variable tuning networks 440, 450 may be in the form of any of the embodiments described in conjunction with FIG. 1, 2A-2C, or 3A-3C. The illustrated embodiment corresponds to the embodiments shown in FIGS. 2A-2C. More specifically, the first variable tuning network 440 is shown to include four (i.e., N=4) switched capacitors or non-linear reactance components 441, 442, 443, 444 coupled through connections 445 between the first intermediate node 431 and the second intermediate node 432, and the second variable tuning network 450 is shown to include four switched capacitors or non-linear reactance components 451, 452, 453, 454 coupled through connections 455 between the third intermediate node 433 and the fourth intermediate node 434. Alternatively, as indicated with dashed-line connections 445', 455', the quadrature coupler 400 may be configured in the form of any of the embodiments described in conjunction with FIG. 3A-3C, in which the first variable tuning network 440 is coupled through connections 445' between the first and fourth ports 401, 404, and the second variable tuning network 450 is coupled through connections 455' between the second and third ports 402, 403.

As discussed in conjunction with FIGS. 2A and 3A, elements 441-444, 451-454 may be implemented as non-linear reactance components, such as PTICs. Alternatively, as discussed in conjunction with FIGS. 2B and 3B, elements 441-444, 451-454 may be implemented as "series" capacitance units (i.e., capacitance units, coupled in parallel, each with a capacitor coupled in series with a switching element). In still other embodiments, as discussed in conjunction with FIGS. 2C and 3C, elements 441-444, 451-454 may be implemented as "parallel" capacitance units (i.e., capacitance units, coupled in series, each with a capacitor coupled in parallel with a switching element).

The tuning states of the first and second variable tuning networks 440, 450 (and thus the capacitance values of the networks) are controlled by a controller 470, which provides control signals to the tuning networks 440, 450 over control lines 472. For example, the control signals from the controller 470 may include switch control signals (e.g., when the networks include switched capacitors) and/or bias voltages (e.g., when the networks include PTICs). When the elements 441-445 are variable reactance components, the control signals (e.g., bias voltages) cause the component to have one of a plurality of possible capacitance values. Conversely, when elements 441-444, 451-454 are switched capacitors, the control signals cause each capacitor to be switched into or out of the tuning network 440, 450. According to an embodiment, the controller 470 is coupled to a digital interface 490 (e.g., a SPI or other type of interface), in order to receive higher-level control signals and/or data from outside circuitry (e.g., an RF front end processor or other circuitry). Essentially, the controller 470 converts digital control information from the digital interface 490 into analog control signals.

Figure 5:
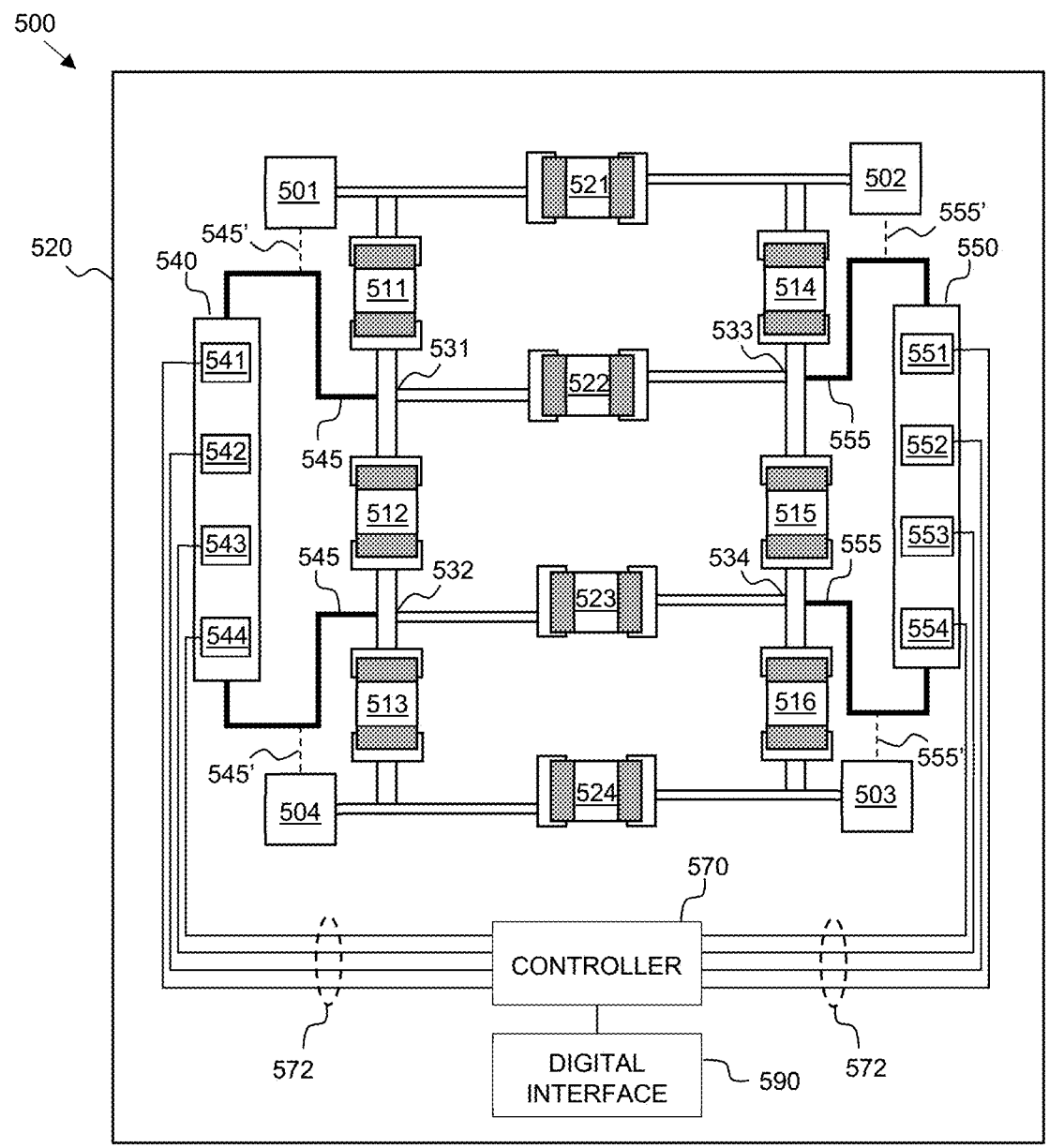
FIG. 5 illustrates a quadrature coupler formed from discrete components, according to another example embodiment.

FIG. 5 illustrates a "discrete" quadrature coupler 500 formed from discrete components on a substrate 520, according to another example embodiment. The substrate 520 may be, for example, a small printed circuit board (PCB) or other suitable substrate.

The quadrature coupler 500 includes first, second, third, and fourth ports 501, 502, 503, 504 (e.g., ports 101-104, FIG. 1), which may be implemented as printed conductive pads exposed at the top or bottom surface of the substrate 520, for example. In addition, the quadrature coupler 500 includes first, second, third, fourth, fifth, and sixth fixed-value capacitors 511, 512, 513, 514, 515, 516, each of which may be implemented as a discrete "chip" capacitor with first and second terminals coupled to bondpads at the top surface of the substrate 520. Through printed conductive traces or transmission lines on or below the surface of the substrate 520, the first, second, and third capacitors 511-513 are coupled in series between the first port 501 and the fourth port 504, with first and second intermediate nodes 531, 532 between the capacitors. Through additional printed conductive traces or transmission lines on or below the surface of the substrate 520, the fourth, fifth, and sixth capacitors 514-516 are coupled in series between the second port 502 and the third port 503, with a third and fourth intermediate nodes 533, 534 between the capacitors.

The quadrature coupler 500 also includes first, second, third, and fourth fixed-value inductors 521, 522, 523, 524, each of which may be implemented as a discrete "chip" inductor with first and second terminals coupled to bondpads at the top surface of the substrate 520. Through additional printed conductive traces or transmission lines on or below the surface of the substrate 520, the first inductor 521 is coupled between the first port 501 and the second port 502. Through other additional printed conductive traces or transmission lines on or below the surface of the substrate 520, the second inductor 522 is coupled between the first intermediate node 531 and the third intermediate node 533. Through other additional printed conductive traces or transmission lines on or below the surface of substrate 520, the third inductor 523 is coupled between the second intermediate node 532 and the fourth intermediate node 534. Finally, through still other additional printed conductive traces or transmission lines on or below the surface of the substrate 520, the fourth inductor 524 is coupled between the fourth port 504 and the third port 503.

The quadrature coupler 500 also includes first and second variable tuning networks 540, 550, according to an embodiment. Although the first and second variable tuning networks 540, 550 may be in the form of any of the embodiments described in conjunction with FIG. 1, 2A-2C, or 3A-3C. The illustrated embodiment corresponds to the embodiments shown in FIGS. 2A-2C. More specifically, the first variable tuning network 540 is shown to include four (i.e., N=4) switched capacitors or non-linear reactance components 541, 542, 543, 544 coupled through connections 545 (e.g., printed traces) between the first intermediate node 531 and the second intermediate node 532, and the second variable tuning network 550 is shown to include four switched capacitors or non-linear reactance components 551, 552, 553, 554 coupled through connections 555 (e.g., printed traces) between the third intermediate node 533 and the fourth intermediate node 534. Alternatively, as indicated with dashed-line connections 545', 555', the quadrature coupler 500 may be configured in the form of any of the embodiments described in conjunction with FIG. 3A-3C, in which the first variable tuning network 540 is coupled through connections 545' (e.g., printed traces) between the first and fourth ports 501, 504, and the second variable tuning network 550 is coupled through connections 555' (e.g., printed traces) between the second and third ports 502, 503.

As discussed in conjunction with FIGS. 2A and 3A, elements 541-544, 551-554 may be implemented as non-linear reactance components, such as PTICs. Alternatively, as discussed in conjunction with FIGS. 2B and 3B, elements 541-544, 551-554 may be implemented as "series" capacitance units (i.e., capacitance units, coupled in parallel, each with a capacitor coupled in series with a switching element). In still other embodiments, as discussed in conjunction with FIGS. 2C and 3C, elements 541-544, 551-554 may be implemented as "parallel" capacitance units (i.e., capacitance units, coupled in series, each with a capacitor coupled in parallel with a switching element).

The tuning states of the first and second variable tuning networks 540, 550 (and thus the capacitance values of the networks) are controlled by a controller 570, which provides control signals over control lines 572. For example, the control signals from the controller 570 may include switch control signals (e.g., when the networks include switched capacitors) and/or bias voltages (e.g., when the networks include PTICs). When the elements 541-545 are variable reactance components, the control signals (e.g., bias voltages) cause the component to have one of a plurality of possible capacitance values. Conversely, when elements 541-544, 551-554 are switched capacitors, the control signals cause each capacitor to be switched into or out of the tuning network 540, 550. According to an embodiment, the controller 570 is coupled to a digital interface 590 (e.g., a SPI or other type of interface), in order to receive higher-level control signals and/or data from outside circuitry (e.g., an RF front end processor or other circuitry). Essentially, the controller 570 converts digital control information from the digital interface 590 into analog control signals.

Figure 6:
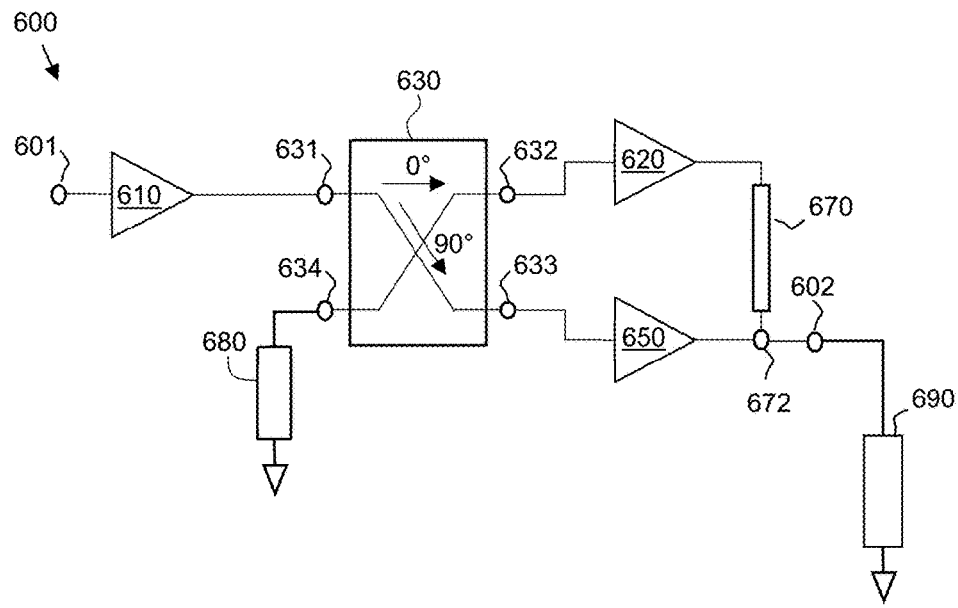
FIG. 6 illustrates a simplified diagram of a power amplifier in which the various embodiments of quadrature couplers may be implemented, according to an example embodiment.

FIG. 6 illustrates a simplified diagram of an embodiment of a power amplifier 600 in which the various embodiments of quadrature couplers 100, 200, 200', 200", 300, 300', 300", 400, 500 may be implemented. More particularly, FIG. 6 is a schematic depiction of a Doherty power amplifier 600. Doherty amplifier 600 includes an RF input node 601, an RF output node 602, a quadrature coupler 630, a first-stage amplifier 610, a carrier amplifier 620, a peaking amplifier 650, an impedance inversion element 670, and a combining node 672, in an embodiment.

When incorporated into a larger RF system, the RF input node 601 is coupled to an RF signal source, and the RF output node 602 is coupled to a load 690 (e.g., an antenna or other load). The RF signal source provides an input RF signal, which is an analog signal that includes spectral energy that typically is centered around one or more carrier frequencies. Fundamentally, the Doherty amplifier 600 is configured to amplify the input RF signal, and to produce an amplified RF signal at the RF output node 602.

The first-stage amplifier 610 has an input coupled to the RF input node 601. The first-stage amplifier 610 is configured to receive and amplify (e.g., pre-amplify) the input RF signal, and to produce an amplified RF signal. The amplified RF signal is then provided to the quadrature coupler 630.

The quadrature coupler 630 may have any of the configurations described above in conjunction with FIGS. 1, 2A-2C, and 3A-3C. The quadrature coupler 630 has first, second, third, and fourth ports 631, 632, 633, 634 (e.g., ports 101-104, FIGS. 1, 2A-2C, 3A-3C). The first port 631 (input port) of the quadrature coupler 630 is coupled to the output of the first-stage amplifier 610 (if included) to receive the amplified input RF signal. Essentially, the quadrature coupler 630 is configured to divide the power of the amplified input RF signal received at port 631 into first and second RF signals (or carrier and peaking signals), which are provided to the carrier and peaking amplifiers 620, 630 through ports 622, 623 (first and second output ports, or direct and coupled ports). The carrier and peaking signals are provided at ports 622, 623 with about 90 degrees of phase difference. The fourth port 634 (isolated port) of the quadrature coupler 630 is coupled to ground (e.g., through resistor 680).

When Doherty amplifier 600 has a symmetrical configuration (i.e., a configuration in which the carrier and peaking amplifier power transistors are substantially identical in size), the quadrature coupler 630 may divide or split the input RF signal received at port 631 into two signals that are very similar with, in some embodiments, equal power. Conversely, when Doherty amplifier 600 has an asymmetrical configuration (i.e., a configuration in which one of the amplifier power transistors, typically the peaking amplifier transistor, is significantly larger), the quadrature coupler 630 may output carrier and peaking signals having unequal power. As discussed in detail above, this may be accomplished by controlling the coupling factor, K, of the quadrature coupler 630 to achieve an unequal power split.

The output ports 632, 633 of the quadrature coupler 630 are connected to the carrier and peaking amplifiers 620, 650, respectively. The carrier amplifier 620 is configured to amplify the carrier signal from port 632 of the quadrature coupler 630, and to provide the amplified carrier signal through the impedance inversion element 670 to the power combining node 672. Similarly, the peaking amplifier 650 is configured to amplify the peaking signal from port 633 of the quadrature coupler 630, and to provide the amplified peaking signal to the power combining node 672.

The impedance inversion element 670 is designed so that the amplified carrier and peaking signals arrive in phase with each other at the power combining node 672. For example, the impedance inversion element 670 may include a lambda/4 ($\lambda/4$) transmission line phase shift element (e.g., a microstrip line), which imparts about a 90 degree relative phase shift to the carrier signal after amplification by the carrier amplifier 620. Accordingly, the amplified carrier and peaking RF signals combine in phase at the combining node 672.

The combining node 672 is electrically coupled to the RF output node 602 to provide the amplified and combined output RF signal to the RF output node 602. The output RF signal produced at RF output node 602 then may be provided to an output load 690 (e.g., an antenna).

Amplifier 600 is configured so that the carrier amplifier 620 provides amplification for relatively low level input signals, and both the carrier and peaking amplifiers 620, 650 operate in combination to provide amplification for relatively high level input signals. This may be accomplished, for example, by biasing the carrier amplifier 620 so that the carrier amplifier 620 operates in a class AB mode, and biasing the peaking amplifier 650 so that the peaking amplifier 650 operates in a class C mode.

Although an example is given herein of an embodiment of a quadrature coupler (e.g., any one of quadrature couplers 100, 200, 200', 200", 300, 300', 300", 400, 500, FIGS. 1, 2A-2C, 3A-3C, 4, 5) being included in a Doherty power amplifier (e.g., amplifier 600), embodiments of quadrature couplers alternatively may be used in other types of circuitry that may benefit from low-loss splitting of an input signal into two signals with equal or unequal power and with about 90 degrees of phase difference. Accordingly, the example Doherty power amplifier 600 described herein is not meant to limit the scope of applicability of the quadrature coupler embodiments described herein.

Figure 7:
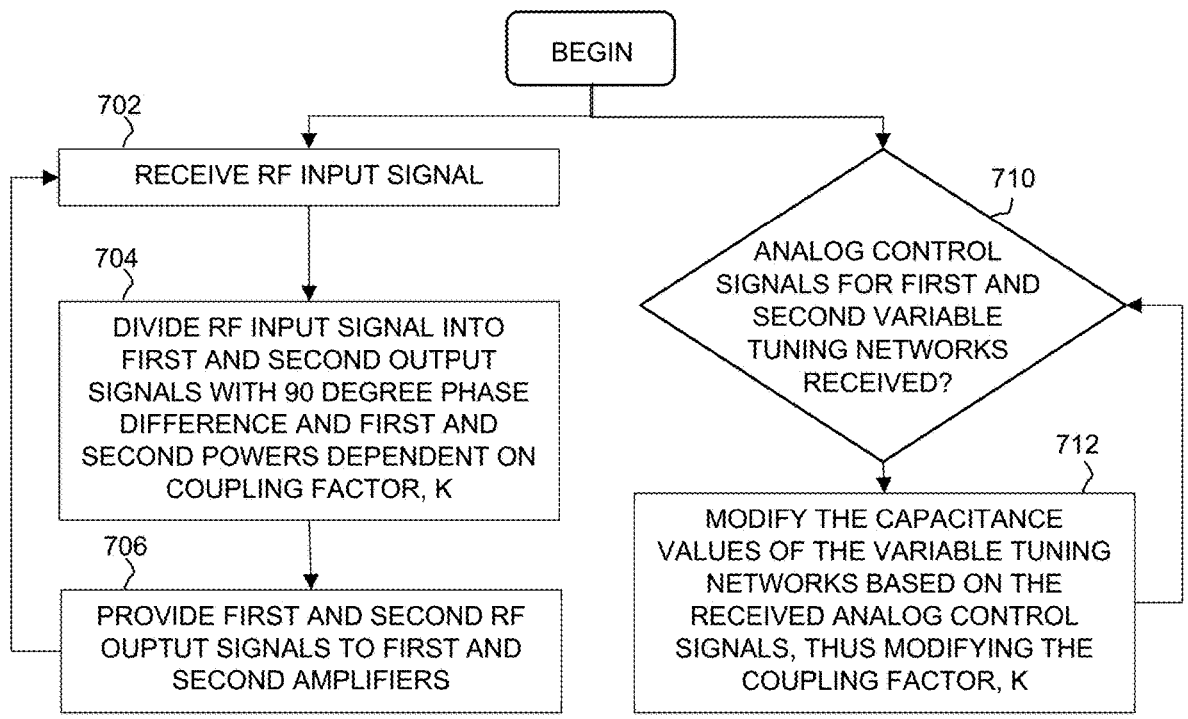
FIG. 7 illustrates a flowchart of a method of operating a quadrature coupler with variable capacitance circuits, according to an embodiment.

FIG. 7 illustrates a flowchart of a method of operating a quadrature coupler (e.g., quadrature couplers 200, 200', 200", 300, 300', 300", 400, 500, 630) with variable capacitance circuits, according to an embodiment. Operation of the quadrature coupler begins, in block 702, by receiving an input RF signal at a first port (e.g., port 101). In block 704, the quadrature coupler divides the input RF signal into first and second output RF signals, imparts a phase shift of about 90 degrees between the signals, and, in block 706, provides the output RF signals to second and third ports (e.g., ports 102, 103).

The percentage of power delivered to each of the first and second output RF signals depends on the coupling factor, K, of the quadrature coupler. In various embodiments discussed previously, the quadrature coupler may include first and second variable tuning networks (e.g., circuits 240, 240', 240", 250, 250', 250"), which enable the coupling factor to be varied.

Accordingly, before, after, or simultaneously with blocks 702, 704, and 706, the quadrature coupler (and more specifically, the tuning networks) may receive one or more analog control signals (e.g., bias voltages and/or switch control signals from controller 470, 570), which may cause the coupling factor of the quadrature coupler to be modified. More particularly, when analog control signals for the first and second tuning networks have been received by the tuning networks, as indicated in block 710, this causes the capacitance values for the tuning networks to be modified, in block 712 (e.g., by changing the capacitance value of a variable reactance component and/or switching capacitors into or out of a switched capacitor network). Changing the capacitance values of the tuning networks, in turn, causes the coupling factor of the quadrature coupler to be modified. Accordingly, the relative amount of signal power delivered to the second and third ports also is modified.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A quadrature coupler comprising:
   first, second, third, and fourth ports;
   first, second, third, and fourth inductors; and
   first, second, third, fourth, fifth, and sixth capacitors, wherein
   the first, second, and third capacitors are coupled in series between the first port and the fourth port, with a first intermediate node between the first and second capacitors, and with a second intermediate node between the second and third capacitors,
   the fourth, fifth, and sixth capacitors are coupled in series between the second port and the third port, with a third intermediate node between the fourth and fifth capacitors, and with a fourth intermediate node between the fifth and sixth capacitors,
   the first inductor is coupled between the first port and the second port,
   the second inductor is coupled between the first intermediate node and the third intermediate node,
   the third inductor is coupled between the second intermediate node and the fourth intermediate node, and
   the fourth inductor is coupled between the fourth port and the third port.

2. The quadrature coupler of claim 1, wherein:
the quadrature coupler is configured to receive an input radio frequency signal, divide power of the input RF signal into first and second output RF signals, impart a 90 degree phase difference between the first and second output RF signals, and provide the first and second output RF signals to the second and third ports.

3. The quadrature coupler of claim 1, further comprising:
a first variable tuning network coupled between the first port and the fourth port; and
a second variable tuning network coupled between the second port and the third port.

4. The quadrature coupler of claim 3, wherein:
the first variable tuning network is connected between the first port and the fourth port, and the second variable tuning network is connected between the second port and the third port.

5. The quadrature coupler of claim 3, wherein:
the first variable tuning network is connected between the first intermediate node and the second intermediate node, and
the second variable tuning network is connected between the third intermediate node and the fourth intermediate node.

6. The quadrature coupler of claim 3, wherein the first variable tuning network includes a first non-linear reactance component, and the second variable tuning network includes a second non-linear reactance component.

7. The quadrature coupler of claim 6, wherein the first non-linear reactance component is controlled with a first bias voltage, and the second non-linear reactance component is controlled with a second bias voltage.

8. The quadrature coupler of claim 3, wherein the first variable tuning network includes a seventh capacitor and a first switch, and the second variable tuning network includes an eighth capacitor and a second switch.

9. The quadrature coupler of claim 8, wherein:
the seventh capacitor and the first switch are connected in parallel; and
the eighth capacitor and the second switch are connected in parallel.

10. The quadrature coupler of claim 8, wherein:
the seventh capacitor and the first switch are connected in series; and
the eighth capacitor and the second switch are connected in series.

11. The quadrature coupler of claim 3, wherein:
the first variable tuning network and the second variable tuning network are controllable to have a same capacitance value at any given time.

12. The quadrature coupler of claim 3, wherein the first variable tuning network and the second variable tuning network tune a coupling factor of the quadrature coupler.

13. The quadrature coupler of claim 3, wherein the first variable tuning network includes a first plurality of capacitors and switches to provide a first tunable capacitance, and the second variable tuning network includes a second plurality of capacitors and switches to provide a second tunable capacitance.

14. The quadrature coupler of claim 1, wherein:
the first, third, fourth, and sixth capacitors each have a first capacitance value;
the second and fifth capacitors each have a second capacitance value that is different from the first capacitance value;
the first and fourth inductors each have a first inductance value; and
the second and third inductors each have a second inductance value that is different from the first inductance value.

15. A power amplifier comprising:
a first amplifier with a first amplifier input;
a second amplifier with a second amplifier input;
a quadrature coupler that includes
a first port,
a second port coupled to the first amplifier input,
a third port coupled to the second amplifier input,
a fourth port,
first, second, third, and fourth inductors, and
first, second, third, fourth, fifth, and sixth capacitors, wherein
the first, second, and third capacitors are coupled in series between the first port and the fourth port, with a first intermediate node between the first and second capacitors, and with a second intermediate node between the second and third capacitors,
the fourth, fifth, and sixth capacitors are coupled in series between the second port and the third port, with a third intermediate node between the fourth and fifth capacitors, and with a fourth intermediate node between the fifth and sixth capacitors,
the first inductor is coupled between the first port and the second port,
the second inductor is coupled between the first intermediate node and the third intermediate node,
the third inductor is coupled between the second intermediate node and the fourth intermediate node, and
the fourth inductor is coupled between the fourth port and the third port.

16. The power amplifier of claim 15, further comprising:
a first variable tuning network coupled between the first port and the fourth port;
a second variable tuning network coupled between the second port and the third port;
a controller that controls states of the first variable tuning network and the second variable tuning network; and
a digital interface coupled to the controller.

17. The power amplifier of claim 16, wherein:
the first variable tuning network includes a seventh capacitor and a first switch; and
the second variable tuning network includes an eighth capacitor and a second switch.

18. The power amplifier of claim 16, wherein:
the first variable tuning network includes a first non-linear reactance component; and
the second variable tuning network includes a second non-linear reactance component.

19. A method of operating a quadrature coupler that has first, second, third, and fourth ports, the method comprising:
controlling a capacitance value of a first variable tuning network that is coupled between the first port and the fourth port to tune a coupling factor of the quadrature coupler, wherein the first variable tuning network includes a first capacitor; and
controlling a capacitance value of a second variable tuning network that is coupled between the third port and the fourth port to tune the coupling factor of the quadrature coupler, wherein the second variable tuning network includes a second capacitor,
wherein the quadrature coupler further includes
first, second, third, and fourth inductors, and
third, fourth, fifth, sixth, seventh, and eighth capacitors, wherein the third, fourth, and fifth capacitors are coupled in series between the first port and the fourth port, with a first intermediate node between the third and fourth capacitors, and with a second intermediate node between the fourth and fifth capacitors, the sixth, seventh, and eighth capacitors are coupled in series between the second port and the third port, with a third intermediate node between the sixth and seventh capacitors, and with a fourth intermediate node between the seventh and eighth capacitors, the first inductor is coupled between the first port and the second port, the second inductor is coupled between the first intermediate node and the third intermediate node, the third inductor is coupled between the second intermediate node and the fourth intermediate node, and the fourth inductor is coupled between the fourth port and the third port.

20. The method of claim 19, wherein:

the first variable tuning network includes a first switch connected in parallel with the first capacitor, and controlling the capacitance value of the first variable tuning network comprises controlling the first switch; and the second variable tuning network includes a second switch connected in parallel with the second capacitor, and controlling the capacitance value of the second variable tuning network comprises controlling the second switch.

21. The method of claim 19, wherein:

the first variable tuning network includes a first switch connected in series with the first capacitor, and controlling the capacitance value of the first variable tuning network comprises controlling the first switch; and the second variable tuning network includes a second switch connected in series with the second capacitor, and controlling the capacitance value of the second variable tuning network comprises controlling the second switch.

22. The method of claim 19, wherein:

the first variable tuning network includes a first non-linear reactance component with a first variable capacitance value that is controlled with a first bias voltage, and controlling the first variable capacitance value of the first non-linear reactance component comprises providing the first bias voltage; and the second variable tuning network includes a second non-linear reactance component with a second variable capacitance value that is controlled with a second bias voltage, and controlling the second variable capacitance value of the second non-linear reactance component comprises providing the second bias voltage.

* * * * *